(12) United States Patent
Hasharoni et al.

(10) Patent No.: US 10,656,349 B2
(45) Date of Patent: May 19, 2020

(54) OPTICAL COUPLER AND OPTICAL FIBER PASSIVE ALIGNMENT

(71) Applicant: DustPhotonics Ltd., Modiin (IL)

(72) Inventors: Jacob Hasharoni, Srigim (IL); Ben Rubovitch, Modiin (IL); Mordechai Cabessa, Netanya (IL); Amir Geron, Modiin (IL)

( * ) Notice: Subject to any disclaimer, the term of this patent is extended or adjusted under 35 U.S.C. 154(b) by 0 days.

(21) Appl. No.: 15/796,860

(22) Filed: Oct. 30, 2017

(65) Prior Publication Data

US 2019/0129105 A1  May 2, 2019

(51) Int. Cl.
  *G02B 6/42* (2006.01)
  *H01S 5/183* (2006.01)
  *H01S 5/022* (2006.01)

(52) U.S. Cl.
  CPC ......... *G02B 6/4206* (2013.01); *G02B 6/423* (2013.01); *G02B 6/4231* (2013.01); *G02B 6/4274* (2013.01); *G02B 6/425* (2013.01); *G02B 6/4214* (2013.01); *G02B 6/4246* (2013.01); *G02B 6/4298* (2013.01); *H01S 5/02276* (2013.01); *H01S 5/183* (2013.01)

(58) Field of Classification Search
  CPC ..... G02B 6/423; G02B 6/4246; G02B 6/4225
  See application file for complete search history.

(56) References Cited

U.S. PATENT DOCUMENTS

| | | | |
|---|---|---|---|
| 2012/0189254 A1* | 7/2012 | Wang | G02B 6/4246 385/93 |
| 2014/0133864 A1* | 5/2014 | Asghari | G02B 6/423 398/141 |
| 2016/0147026 A1* | 5/2016 | Kurtz | G02B 6/3839 385/89 |

* cited by examiner

*Primary Examiner* — Sung H Pak
*Assistant Examiner* — Hoang Q Tran
(74) *Attorney, Agent, or Firm* — Reches Patents

(57) ABSTRACT

A method for passively coupling an optical fiber to an optoelectronic chip, the method may include connecting the optical fiber to an optical cable interface of a first portion of an optical coupler; wherein the optical coupler further comprises a second portion; wherein the first portion comprises first optics that comprises a first lens array, an optical cable interface and three contact elements, each contact element has a spherical surface; and wherein the second portion comprises second optics that comprise a second lens array, and three elongated grooves; connecting the optical coupler to a substrate that supports the optoelectronic chip; and mechanically coupling the first portion to the second portion by aligning the three contact elements of the first portion with the three elongated grooves of the second portion thereby an optical axis related to a first lens array of the first portion passes through a point of intersection between longitudinal axes of the three elongated grooves, and an optical axis related to the second lens array passes through the point of intersection.

23 Claims, 8 Drawing Sheets

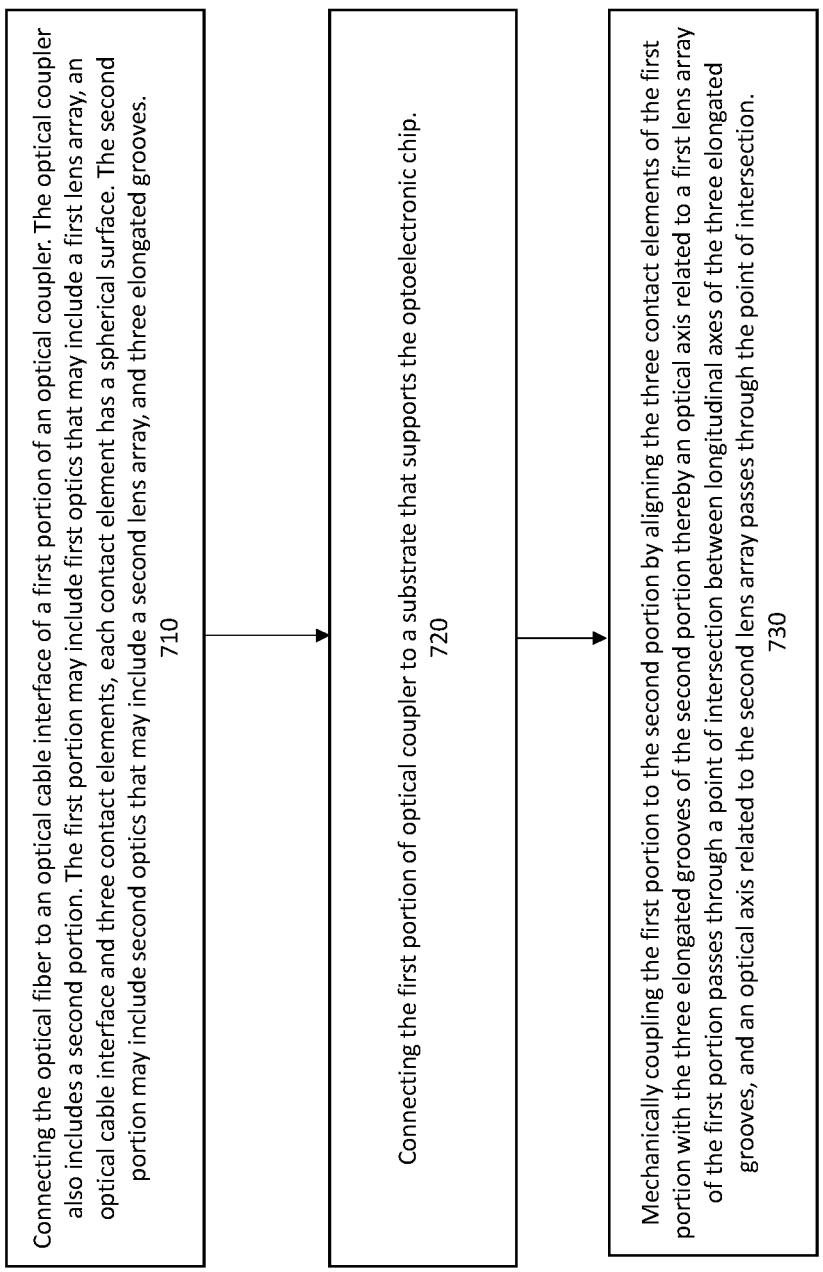

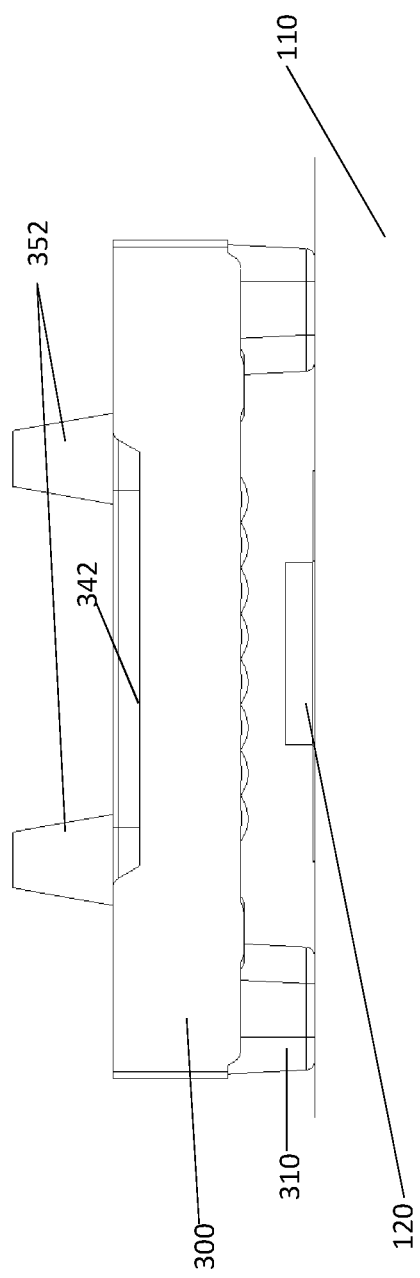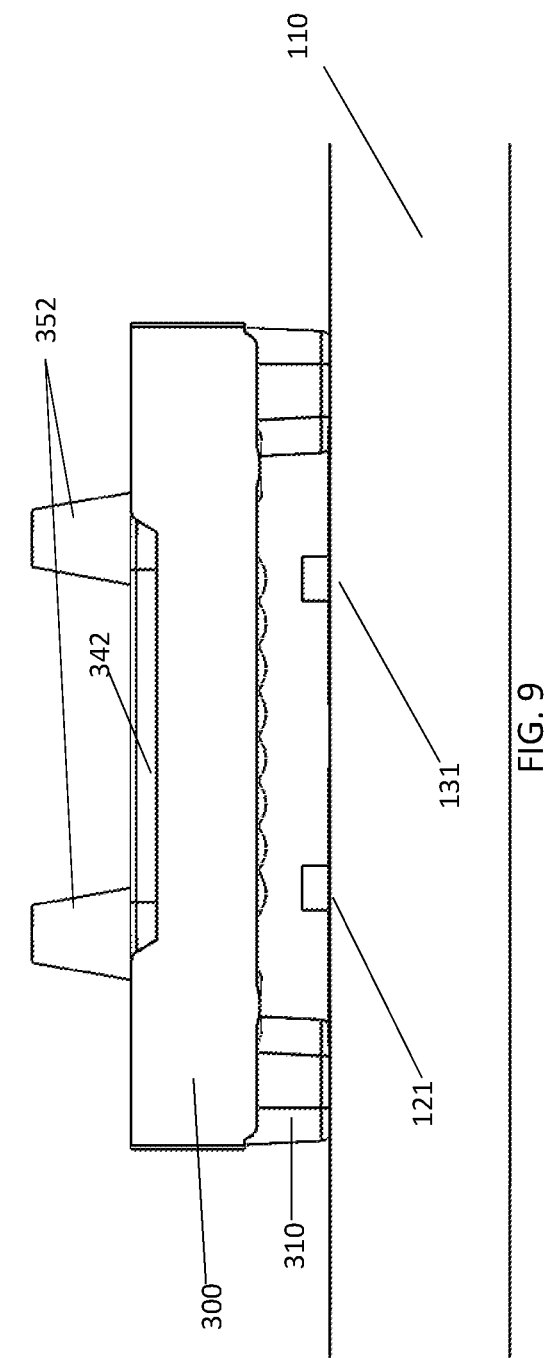

OPTICAL COUPLER AND OPTICAL FIBER PASSIVE ALIGNMENT

FIELD

This invention relates to package of electro-optical components and more specifically, to passive alignment of fiber optics to and from the electro-optical components.

BACKGROUND

Optical devices utilizing optoelectronic chips such as lasers and photodetectors (PD) require coupling the light to and from optical fibers. Such devices can be found for example in telecom or Datacom applications, fiber sensors and various medical diagnostic applications. The complexity of fiber coupling increases significantly as the fiber core diameter decreases since the spot size of the optoelectronic chip needs to be similar to that of the fiber. In addition, the numerical aperture (NA) on both sides should match to allow efficient coupling within the fiber angular acceptance cone. Fibers used in optical communication applications are either multimode or single mode with a core diameter of 50 and 9 micron, respectively.

The small core diameter imposes stringent limitations on the coupling efficiency that are directly affecting the overall cost of the device. In principle, the light from a laser source is routed via a lens to the fiber input face. On the opposite side of the optical link, light coming out from the fiber is focused with a lens such that all of the light is incident on the PD aperture. As Telecom and Datacom data rate increase beyond 25 Gb/s to 50 Gb/s and higher, the apertures of both lasers and PD decrease making fiber coupling more complicated since both the spot size and angular distribution are more difficult to control.

High efficiency fiber coupling can be achieved if an active alignment scheme is used. This scheme involves powering up all electrical and optoelectronic chips on the device and carrying out the alignment while monitoring the laser optical power coupled into the fiber, or by monitoring the photo-current resulting from coupling light from the fiber to the PD. It can be appreciated that active fiber alignment is a costly and labor-intensive process that is not suitable to volume production of optical modules.

SUMMARY

There may be provided an optical coupler that may include a first portion and a second portion; wherein the first portion may include a first optics that may include a first lens array, an optical cable interface and three contact elements, each contact element has a spherical surface; and wherein the second portion may include second optics that may include a second lens array, and three elongated grooves; wherein when the first and second portions may be mechanically coupled to each other the three elongated grooves may be aligned with the three contact elements, an optical axis related to the first lens array passes through a point of intersection between longitudinal axes of the three elongated grooves, and an optical axis related to the second lens array passes through the point of intersection.

The first lens array may include collimating lenses and the second optics may include a folding optical element.

The optical cable interface may include multiple recesses for receiving multiple cables, wherein the interfaces face the folding optical element.

The three elongated grooves may be spaced apart by 20 degrees.

The longitudinal axis of a first elongated groove of the three elongated grooves may be parallel to an optical axis defined by the optical cable interface.

The second and third elongated grooves of the three elongated grooves may be arranged in a symmetrical manner in relation to a longitudinal axis of a first elongated groove of the three elongated grooves.

The optical coupler further may include a holder for mechanically coupling the first and second portions.

The second portion may include spacers for positioning the second portion above an electro-optical element.

The at least one first lens of the first lens array may be configured to receive an input light beam over an angular range that may be not smaller than thirty degrees.

The first lens of the first lens array may be configured to collimate a light beam generated by a laser and wherein a second lens of the first lens array may be configured to focus a light beam received from an optical fiber and passed through a corresponding lens of the second lens array.

The first and second portions may include rough alignment elements.

The first portion may include a first plate, wherein a lower part of the first lens array extends below a lower surface of the first plate, wherein the optical cable interface may be formed at an upper surface of the first plate; wherein a folding optical element extends above the first surface; and wherein the three contact elements extend below the first surface.

The second portion may include a second plate, wherein a lower part of the second lens array extends below a lower surface of the second plate, wherein the three elongated grooves may be formed in the upper surface of the second plate.

The first lens array may include redundant lenses.

There may be provided an optical coupler that may include a first portion and a second portion; wherein the first portion may include a first optics that may include a first lens array, an optical cable interface and three elongated grooves; and wherein the second portion may include second optics that may include a second lens array, and three contact elements, each contact element has a spherical surface; wherein when the first and second portions may be mechanically coupled to each other the three elongated grooves may be aligned with the three contact elements, an optical axis related to the first lens array passes through a point of intersection between longitudinal axes of the three elongated grooves, and an optical axis related to the second lens array passes through the point of intersection.

There may be provided an optical coupler that may include a first portion and a second portion; wherein the first portion may include a first optics that may include a first lens array, three first interconnecting elements and an optical cable interface; wherein the second portion may include second optics that may include a second lens array and three second interconnecting elements; wherein the three first interconnecting elements and the three second interconnecting elements form a kinematic mount when the first portion and the second portion may be mechanically coupled to each other; and wherein a center of stability defined by the kinematic mount virtually crosses the first lens array and the second lens array when the first portion and the second portion may be mechanically coupled to each other.

The center of stability may be located at an incenter defined by the kinematic mount.

There may be provided a method for passively coupling an optical fiber to an optoelectronic chip, the method may include connecting the optical fiber to an optical cable interface of a first portion of an optical coupler; wherein the optical coupler further may include a second portion; wherein the first portion may include first optics that may include a first lens array, an optical cable interface and three contact elements, each contact element has a spherical surface; and wherein the second portion may include second optics that may include a second lens array, and three elongated grooves; connecting the optical coupler to a substrate that supports the optoelectronic chip; and mechanically coupling the first portion to the second portion by aligning the three contact elements of the first portion with the three elongated grooves of the second portion thereby an optical axis related to a first lens array of the first portion passes through a point of intersection between longitudinal axes of the three elongated grooves, and an optical axis related to the second lens array passes through the point of intersection.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 7 is an example of a method;

FIG. 8 illustrates an optical coupler; and

FIG. 9 illustrates an optical coupler.

DETAILED DESCRIPTION OF THE DRAWINGS

Figure 1:
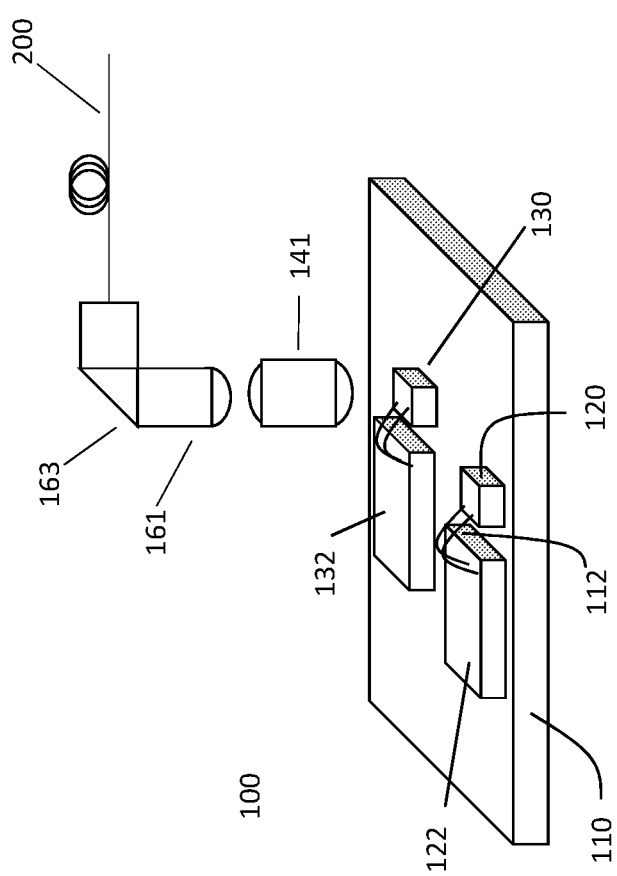
FIG. 1 illustrates an example of a system.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Passive fiber alignment is much more suited for volume production of optical devices as the process can be carried out with fully automated pick-and-place machines using pre-defined alignment marks to locate the coupling elements. The accuracy of passive alignment depends on the assembly machine accuracy and repeatability as well as on the accuracy of the alignment mark. Passive alignment can lead to significant reduction of the device packaging cost due to the lower operation cost, higher machine throughput and since yields tend to be higher with passive, machine-based alignment.

Multimode optical links employ vertically emitting optoelectronic chips namely, vertical-cavity surface-emitting laser (VCSEL) and vertically illuminated p-i-n PDs. These devices are difficult to align as the lens needs to be mounted above the device and a right angle turn of the fiber is required in order to fit the coupling optics within the transceiver housing. Efficient fiber coupling is possible if all optical elements are co-located on an axis given the 6 degrees of freedom. With active alignment, this can be accomplished in a straight-forward way by moving the fiber and/or lens both lateral and angular along the XYZ axes until good coupling is achieved. With passive alignment, the situation is more complicated since mounting the lens and fiber has no feedback and a method must be devised to avoid tilt and rotation.

The following description of the embodiment is based on an optical transceiver for optical communications. However, the invention is valid for other applications as well in which surface emitting laser and surface illuminated PD are being used.

Referring to FIG. 1, the optical transceiver 100 has a substrate 110, VCSEL 120 and PD 130.

The VCSEL is connected via wire bond 112 to laser driver chip 122 and the PD is connected to a trans-impedance amplifier (TIA) 132. A first lens 141 is mounted above VCSEL 120 and above PD 130. The lens 141 may be of any shape such as bi-convex, plano-convex or concave. A second lens 161 is mounted above lens 141 with one curved surface and a right-angle prism 163 used to fold the light by 90° so that the optical axis is collinear with the fiber 200.

VCSEL 120 and PD 130 may be single elements or in array format, typically four elements are used in communication devices, but any other number common in the industry may be used. The lens 141 may be a part of an array with either the same number of optical apertures or higher. Substrate 110 can be a printed circuit board (PCB) or any other suitable electronic substrate. VCSEL driver chip 122, TIA 132, VCSEL 120 and PD 130 are glued onto the substrate 110 using thermal epoxy glue. The distance between the driver chips and the optical chips is very short to enable short length of wire bond 112. The short wire length is critical for obtaining high frequency operation of the laser and photodiodes.

In one embodiment of this invention, the lens array is fabricated such that it has similar dimensions to both VCSEL 120 and PD 130. Two such lenses are assembled, one above the VCSEL and the other above the PD. Using separate lenses has the advantage that the relative orientation of both VCSEL 120 and PD 130 is not relevant. Fiber alignment is carried out independently for each one. The lens array can be aligned above the laser and photodiode arrays using standard pick-and-place machine. Alignment features on both the lens and the laser or PD are used to facilitate accurate positioning of the lens array. A second lens 142 is located above first lens 141 to assist in the light coupling to or from fiber 200.

Figure 2:
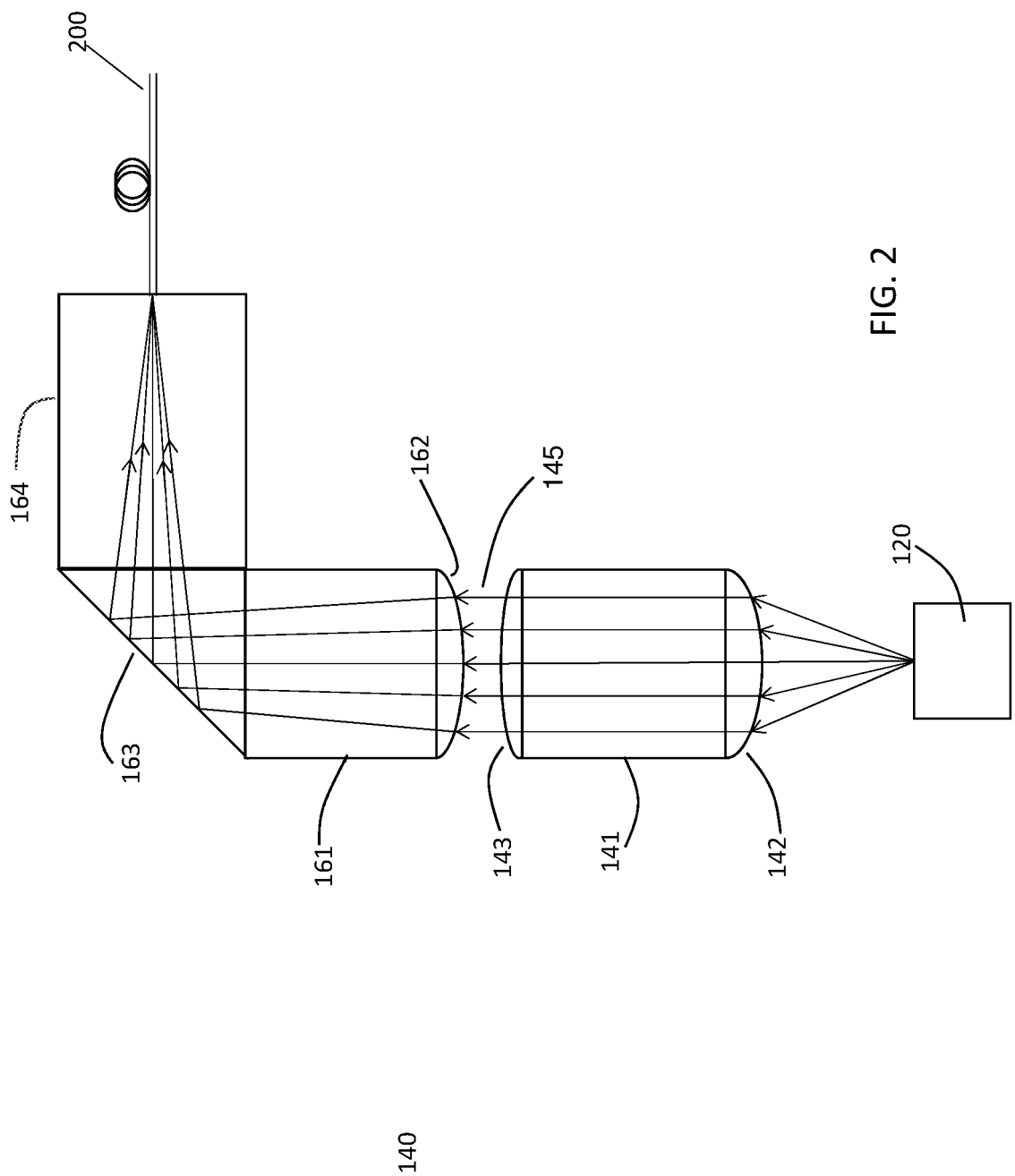
FIG. 2 illustrates a transmit optical path from a transmitting optoelectrical chip to an optical fiber.
Figure 3:
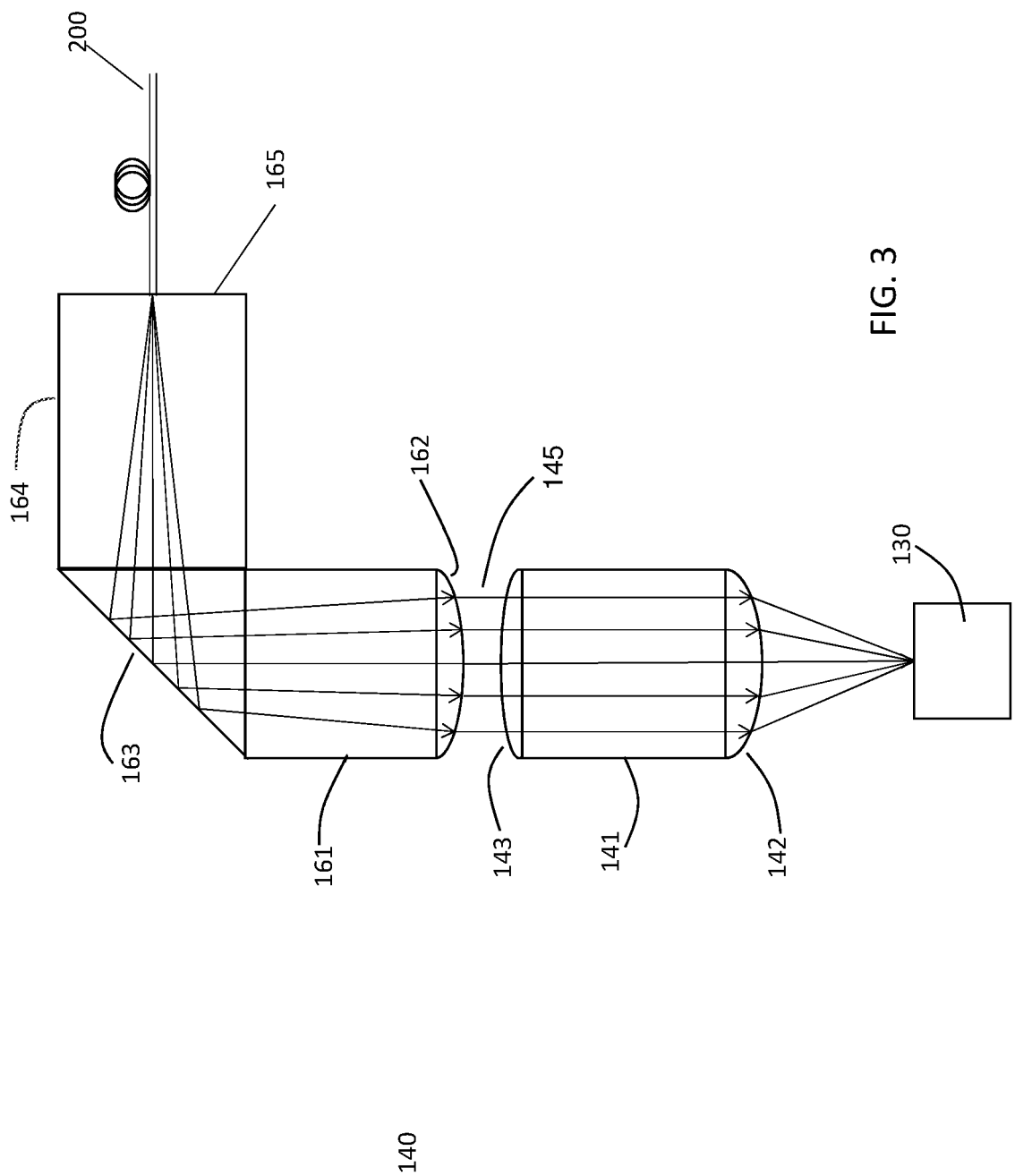
FIG. 3 illustrates a receive optical path from an optical fiber to a receive optoelectrical chip.

FIGS. 2 and 3 illustrates the optical system 140 used for the passive assembly. It is built from two lenses 141 and 161 that function as one optical system. The lens 140 is used for both coupling tasks, VCSEL-to-fiber and fiber-to-PD. Even though the optical path is different in both cases, the design of lens 140 is capable to support both.

In FIG. 2 the optical path from the VCSEL 120 to the fiber 200 is shown; optical surface 142 collects light emitted from VCSEL 120. The surface 142 is designed to collect all the emitted light using an aspherical profile and NA that covers the entire angular distribution of the laser. Minimizing the sensitivity for alignment errors is achieved by designing the optical system as a multi-lens relay that allows for the beam to reach the fiber 200 with minimal distortions due to assembly errors. This task is achieved by broadening the beam to about 200 µm and collimating the light collected using surface 142 and surface 143. The homogenous energy distribution within the broadened beam exhibits minimal sensitivity to misalignment and allows to compensate for tilts and lateral shifts that are inherent to the assembly.

An air gap 145 is located between lens 141 and lens 163; its thickness is determined by the size of the mechanical system used to align and join the two lenses. As the light beam is also collimated in this air space, it shows minimal sensitivity for angular and lateral misalignment between the two elements.

Optical surface 162 collects the light and directs it to the hypotenuse of right angle prism 163. The combined action of surfaces 162, 163 and optical slab 164 is to focus the light tightly on the entry aperture of fiber 200. An underfill launch condition is required to minimize mode excitation achieved by a tightly focused spot on the center of the fiber aperture. Surface 163 may be planner or parabolic or any freeform polynomial surface as required by the optical performance.

FIG. 3 illustrates the optical path from the fiber 200 to PD 130. Light from the fiber 200 is emitted with a NA typical of multimode fibers. Optical surfaces 162, 163 and slab 164 collect the light and shape it such that the beam in air space 145 is fully collimated. Lens 141 focused the light beam onto the PD aperture using optical surface 142. At modulation frequencies of 50 Gb/s using pulse amplitude modulation of 4 or 8 levels, the PD aperture must be minimized to sub-30 µm diameter to maintain the capacitance low enough. The negative magnification required to couple light from the 50 µm fiber core to the PD is the most critical aspect of this invention and obtained using the combined effect of the beam shape and the aspherical profile of surface 142.

Lens system 140 can be fabricated from glass plastic or any suitable material with high transparency at the VCSEL wavelength of 850 nm. If the material is plastic, injection molding may be used to further reduce the device cost. Optical elements 141 and 161 are embedded within a mechanical structure designed to align the lenses passively with respect to the optoelectronic chips or the fibers.

Figure 4B:
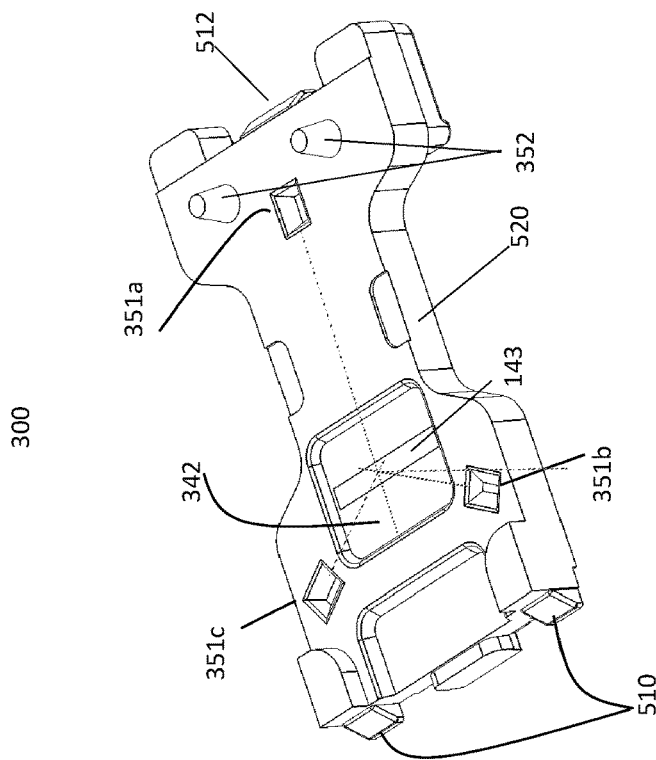
FIGS. 4A-4B are examples of a top view and a bottom view of an optical mount of an electrical coupler.
Figure 4A:
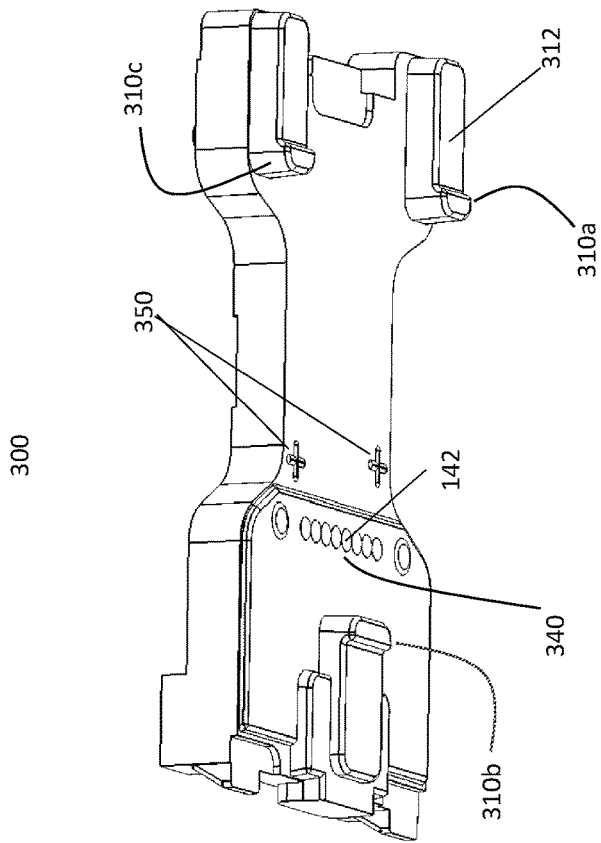

FIGS. 4A and 4B illustrate an optical mount 300 in which lens 141 is enclosed as part of lens array 340.

The bottom side is shown in FIG. 4A with an eight-element lens array 340 where each optical element corresponds to optical lens 141 shown in FIGS. 2 and 3. Typical arrays used in devices for optical communication have four elements per array. Increasing the number of optical lenses 141 to eight, as in this invention, allows freedom to use driver chips from different vendors where the location of the wire bond 112 pads may vary between chips. With a large lens array 340, any combination of VCSEL 120 and driver chip 122 (or PD 130 and TIA chip 132) may be realized even if it implies that the location of the VCSEL (PD) array is shifted laterally with each chip combination.

The optical mount 300 is assembled on the substrate 110 using three legs 310 positioned such that both driver chip 122 (132) and optoelectronic chip 120 (130) can be accommodated in the space created between substrate 110 and optical mount 300. Attachment to the substrate is carried out using a thermal curing epoxy adhesive dispensed on surface 312. The height difference between leg 310 and surface 312 determines the amount of glue used. The adhesion of the epoxy to surface 312 is enhanced by specific treatment of the surface. Accurate alignment of the lens array 340 with respect to VCSEL array 120 or PD array 130 is carried out with a pick-and-place machine using alignment marks 350 whose position with respect to optical lens array 340 is known.

The top side of optical mount 300 is shown in FIG. 4B. Optical lens array 340 is in a recess 342 with optical surfaces 143. The depth of the recess is determined by the required thickness for lens 141. Rough alignment of optical mount 300 with the fiber ferrule 400 is done using guide pins 352. The three V-shaped slots 351 are part of the accurate alignment mechanism described below for assembly of fiber ferrule 400 on mount 300. The slots 351 are oriented at 120° with respect to each other thus defining a geometrical center.

Figure 5B:
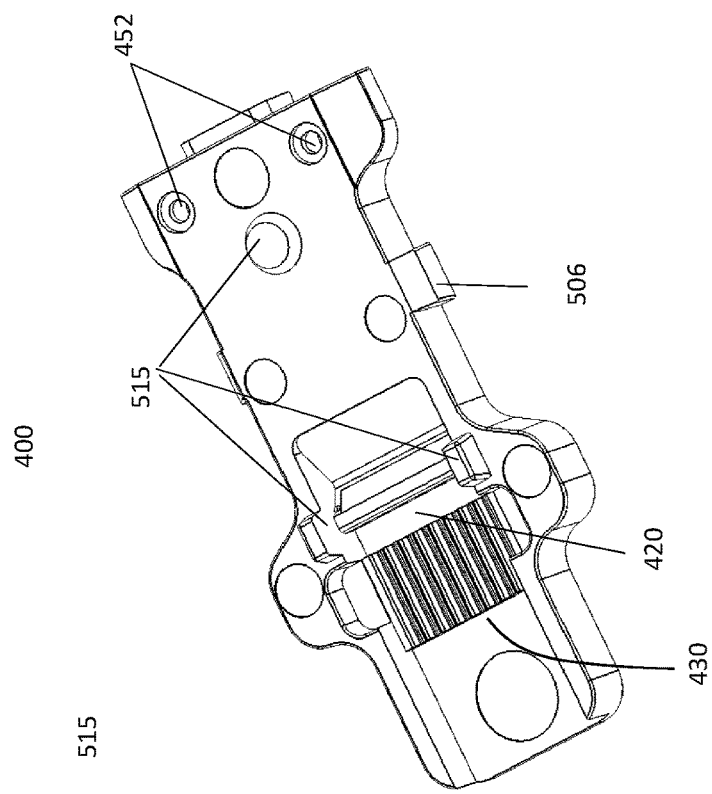
FIGS. 5A-5B are examples of a top view and a bottom view of an optical mount of a fiber ferrule.
Figure 5A:
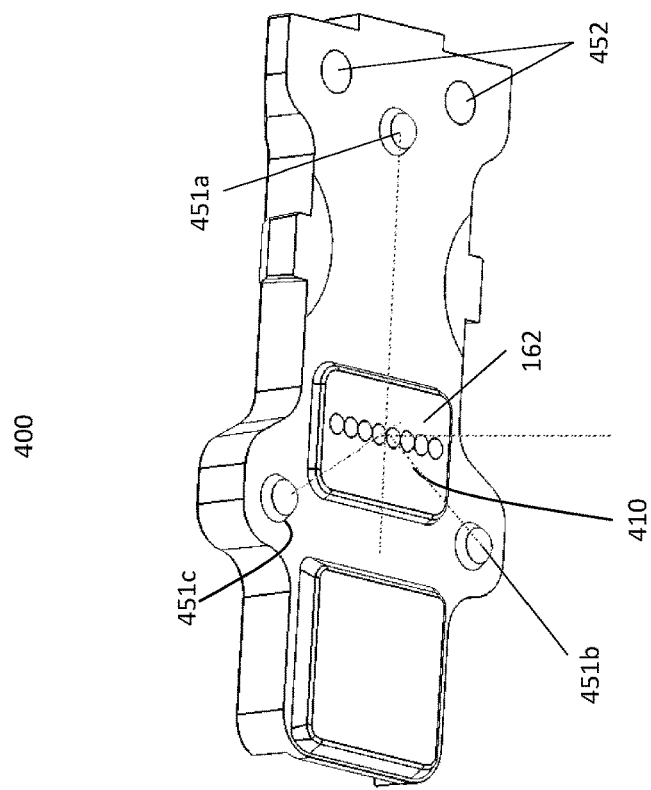

With respect to FIG. 5A, holes 452 allow for guide pins 352 to perform rough mating of optical mount 300 with ferrule 400. Optical lens array 410 has also eight elements each one with lens 162. Accurate alignment of the fiber ferrule 400 on the optical mount 300 is enabled with three balls 451 that self-align onto slots 351 located on the mount. This design overlaps the optical axis of lens array 410 and the optical axis of lens array 340 with the geometric center of the three V-shaped slots 351. The geometrical center location is fully defined and thus its position is fixed even in the case of thermal expansion or mechanical stress. Using V-shaped slots allows to constrain the degrees of freedom. Each slot constrains two degrees of freedom (one per wall) totaling in all six degrees being locked. The ball-slot system allows for alignment of ferrule 400 on mount 300 with sub-micron accuracy.

When the three balls 451*a*, 451*b* and 451*c* are aligned with three grooves 351*a*, 352*b* and 352*c* then the first and second lens arrays are aligned with each other. Furthermore, the first and second lens arrays are located within a center of stability—which is stable (or at least substantially stable) even when the optical coupled device undergoes thermal variations. The first and second lens arrays are relatively stable and thus do not misalign under thermal and/or mechanical stress because the intersection of imaginary longitudinal axes of the three grooves (and an intersection of the three balls) falls on the optical axis of both the first and second optical lens arrays respectively.

In FIG. 5B the top side of the ferrule 400 is shown with a V-groove array 430 that allows for accurate positioning of the fiber ribbon with respect to the optical axis. A fiber ribbon or separate fibers are placed on the v-groove. The fibers terminate on optical surface 165 within enclosure 420 that contains the right-angle prism 163 and lens 162. A drop of optical grade adhesive is used to fix the fibers in place.

Figure 6B:
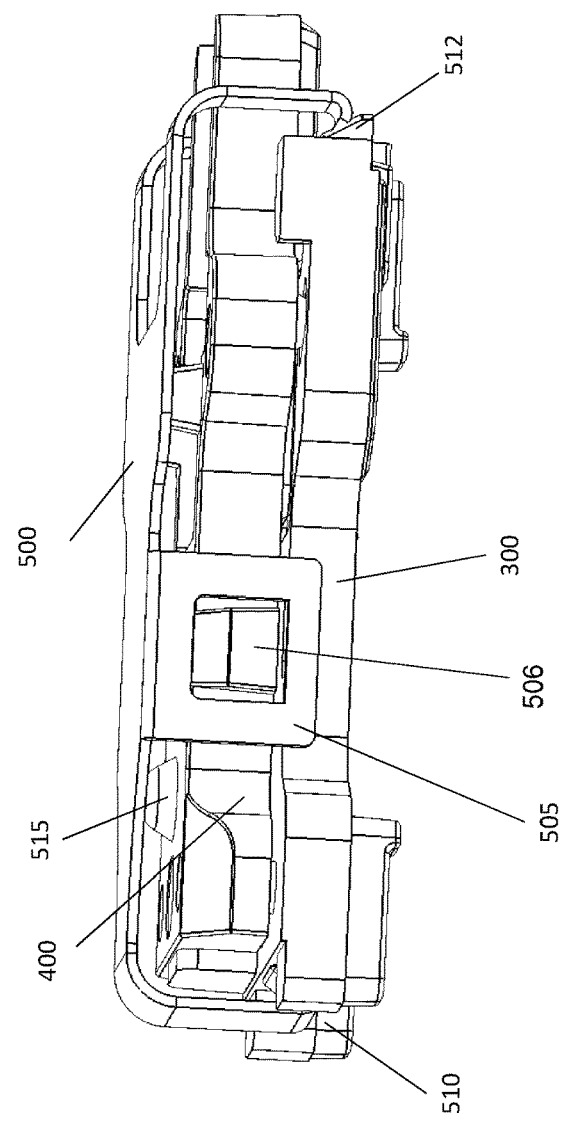
FIG. 6B is an example of a clip that holds the optical mount and the fiber ferrule.
Figure 6A:
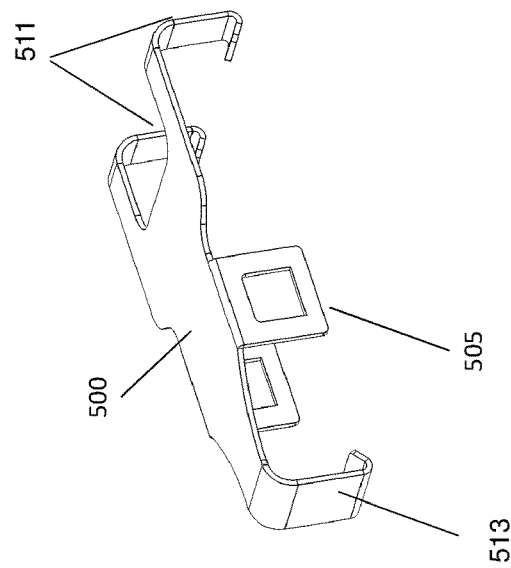
FIG. 6A illustrates an example of a clip.

Attachment of ferrule 400 on mount 300 is carried out using a clip 500 shown in FIG. 6A. The clip may be constructed from metal or other suitable material. It is designed to couple the two optical elements without causing strain. Initial attachment of the clip 500 is done using flexible flange 505 that clips onto slab 506. The reason for this preliminary step is to provide easy assembly for the operator. Mount 300 is thus designed with a narrow waist 520 that allows for clipping of flange 505 on slab 506. Stress-free final attachment of the clip is enabled with the slabs 510 and 512 located on mount 300. Flexible flange 513 and 511 located on clip 500 attach on the three slabs providing the full attachment as needed. To distribute the stress originating by clip 500, three studs 515 located on the top surface of ferrule 400 are used.

The assembled device is shown in FIG. 6B. Because of its simplicity, the clip is snapped-on using either manual or automatic placement.

FIG. 7 illustrates an example of method 700.

Method 700 may include the following steps:

a. Connecting the optical fiber to an optical cable interface of a first portion of an optical coupler. The optical coupler also includes a second portion. The first portion may include first optics that may include a first lens array, an optical cable interface and three contact elements, each contact element has a spherical surface. The second portion may include second optics that may include a second lens array, and three elongated grooves. 710. The first portion may be fiber ferrule 400. The second portion may be optical mount 300.

b. Connecting the first portion of optical coupler to a substrate that supports the optoelectronic chips. 720.

c. Mechanically coupling the first portion to the second portion by aligning the three contact elements of the first portion with the three elongated grooves of the second portion thereby an optical axis related to a first lens array of the first portion passes through a point of intersection between longitudinal axes of the three elongated grooves, and an optical axis related to the second lens array passes through the point of intersection. 730.

Method 700 is a passive method in the sense that successful alignment may be achieved when following steps 710, 720 and 730—and there is no need to monitor the alignment process by activating the electro-optical circuits and any other circuit. It is noted that method 700 may include actively monitoring the alignment—but this is not necessarily so.

The number of optical paths may equal to the number of optical couplers or may differ from the number of optical couplers. An optical path is associated with a single fiber and/or a single laser. A single optical coupler may be placed over an array of photodiodes. A single optical coupler may be placed over an array of lasers. A single optical coupler may be placed over a combination of (i) one or more photodiodes, and (ii) one or more lasers.

The same optical coupler may be used for both receive path and transmit path.

A single optical coupler may be positioned in both (a) one or more transmit optical paths and (b) one or more receive optical paths. Alternatively, a separate optical coupler may be positioned in one or more transmit optical paths and a separate optical coupler may be positioned in one or more receive optical paths.

FIG. 8 illustrates optical mount 300 that is positioned at transmit paths of multiple optoelectronic chips 120. The optoelectronic chips 120 are supported by substrate 110. The optical mount 300 is shown as including three legs 310, guide pins 352 and recess 342.

FIG. 9 illustrates optical mount 300 that is positioned at a transmit path of optoelectronic chip 121 and at a receive path of PD 131. The optoelectronic chip 121 and PD 131 are supported by substrate 110. The optical mount 300 is shown as including three legs 310, guide pins 352 and recess 342.

The terms "including", "comprising", "having", "consisting" and "consisting essentially of" are used in an interchangeable manner. For example—any module or chip may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An optical coupler that comprises a first portion and a second portion;
    wherein the first portion comprises a first optics that comprise a first lens array, an optical cable interface and three contact elements, each contact element has a hemisphere shaped end; wherein the three contact elements comprise a first contact element, a second contact element and a third contact element, and
    wherein the second portion comprises second optics that comprise a second lens array, and three elongated grooves, wherein each elongated groove of the three elongated grooves has a cross section that gradually decreases in a linear manner towards a bottom of the elongated groove; wherein a shape of an exterior of each contact element of the three contact elements differs from a shape of each elongated groove;
    wherein when the first and second portions are mechanically coupled to each other then (a) the three elongated grooves are aligned with the three contact elements, the three contact elements are pressed against interiors of the three elongated grooves and penetrate by a predefined distance the interiors of the three elongated grooves, each elongated slot constrains two degrees of freedom, thereby forming a kinematic mount that constraints exactly six degrees of freedom; and (b) an optical axis related to the first lens array passes through a point of intersection between longitudinal axes of the three elongated grooves, and an optical axis related to the second lens array passes through the point of intersection.

2. The optical coupler according to claim 1, wherein the first lens array comprises collimating lenses and the second optics comprises a folding optical element.

3. The optical coupler according to claim 2, wherein the optical cable interface comprises multiple recesses for receiving multiple cables, wherein the interfaces face the folding optical element.

4. The optical coupler according to claim 1, wherein longitudinal axes of the three elongated grooves are oriented to each other by 120 degrees.

5. The optical coupler according to claim 1, wherein a longitudinal axis of a first elongated groove of the three elongated grooves is parallel to an optical axis defined by the optical cable interface.

6. The optical coupler according to claim 1, wherein second and third elongated grooves of the three elongated grooves are arranged in a symmetrical manner in relation to a longitudinal axis of a first elongated groove of the three elongated grooves.

7. The optical coupler according to claim 1, further comprising a holder for mechanically coupling the first and second portions.

8. The optical coupler according to claim 1, wherein the second portion comprises spacers for positioning the second portion above an electro-optical element.

9. The optical coupler according to claim 1, wherein at least one first lens of the first lens array is configured to receive an input light beam over an angular range that is not smaller than thirty degrees.

10. The optical coupler according to claim 1, wherein a first lens of the first lens array belongs to a transmit optical path and is configured to collimate a light beam generated by a laser and wherein a second lens of the first lens array belongs to a receive optical path and is configured to focus a light beam received from an optical fiber and passed through a corresponding lens of the second lens array.

11. The optical coupler according to claim 1 wherein the first and second portions comprise rough alignment elements; wherein a distance of the third contact element from each one of the rough alignment elements is smaller than a distance between each one of the rough alignment elements and the first lens array.

12. The optical coupler according to claim 1 wherein the first portion comprises a first plate, wherein a lower part of the first lens array extends below a lower surface of the first plate, wherein the optical cable interface is formed at an upper surface of the first plate; wherein a folding optical element extends above the first surface; and wherein the three contact elements extend below the first surface.

13. The optical coupler according to claim 1 wherein the second portion comprises a second plate, wherein a lower part of the second lens array extends below a lower surface of the second plate, wherein the three elongated grooves are formed in the upper surface of the second plate.

14. The optical coupled according to claim 1 wherein the first lens array comprises redundant lenses.

15. An optical coupler that comprises a first portion and a second portion; wherein the first portion comprises a first optics that comprise a first lens array, an optical cable interface and three elongated grooves; wherein each elongated groove of the three elongated grooves has a cross section that gradually decreases in a linear manner towards a bottom of the elongated groove; and wherein the second portion comprises second optics that comprise a second lens array, and three contact elements, each contact element has a hemisphere shaped end; wherein the three contact elements comprise a first contact element, a second contact element and a third contact element; wherein a shape of an exterior of each contact element of the three contact elements differs from a shape of each elongated groove; wherein when the first and second portions are mechanically coupled to each other then (a) the three elongated grooves are aligned with the three contact elements, the three contact elements are pressed against interiors of the three elongated grooves and penetrate by a predefined distance the interiors of the three elongated grooves, each elongated slot constrains two degrees of freedom, thereby forming a kinematic mount that constraints exactly six degrees of freedom; and (b) an optical axis related to the first lens array passes through a point of intersection between longitudinal axes of the three elongated grooves, and an optical axis related to the second lens array passes through the point of intersection.

16. An optical coupler that comprises a first portion and a second portion; wherein the first portion comprises a first optics that comprise a first lens array, three first interconnecting elements and an optical cable interface; wherein the second portion comprises second optics that comprise a second lens array and three second interconnecting elements; wherein the three first interconnecting elements and the three second interconnecting elements form a kinematic mount that constraints exactly six degrees of freedom when the first portion and the second portion are mechanically coupled to each other; and wherein a center of stability defined by the kinematic mount virtually crosses the first lens array and the second lens array when the first portion and the second portion are mechanically coupled to each other wherein a first contact element and a second contact element of the three contact elements are positioned on one side of the first lens array and at a first distance from the first lens array; wherein a third contact element of the three contact elements is positioned at a second side of the first lens array and at a second distance from the second lens array; wherein the second distance is at least twice the first distance.

17. The optical coupler according to claim 16 wherein the center of stability is located at an incenter defined by the kinematic mount.

18. A method for passively coupling an optical fiber to an optoelectronic chip, the method comprises: connecting the optical fiber to an optical cable interface of a first portion of an optical coupler; wherein the optical coupler further comprises a second portion; wherein the first portion comprises first optics that comprises a first lens array, an optical cable interface and three contact elements, each contact element has a hemisphere shaped end; and wherein the second portion comprises second optics that comprise a second lens array, and three elongated grooves; wherein each elongated groove of the three elongated grooves has a cross section that gradually decreases in a linear manner towards a bottom of the elongated groove; connecting the optical coupler to a substrate that supports the optoelectronic chip; wherein a shape of an exterior of each contact element of the three contact elements differs from a shape of each elongated groove and mechanically coupling the first portion to the second portion by aligning the three contact elements of the first portion with the three elongated grooves of the second portion thereby an optical axis related to a first lens array of the first portion passes through a point of intersection between longitudinal axes of the three elongated grooves, and an optical axis related to the second lens array passes through the point of intersection; wherein when aligned the three contact elements are pressed against interiors of the three elongated grooves and penetrate by a predefined distance the interiors of the three elongated grooves each elongated slot constrains two degrees of freedom, thereby forming a kinematic mount that constraints exactly six degrees of freedom.

19. The optical coupler according to claim 1 wherein a first contact element and a second contact element of the three contact elements are positioned on one side of the first lens array and at a first distance from the first lens array; wherein a third contact element of the three contact elements is positioned at a second side of the first lens array and at a second distance from the second lens array; wherein the second distance is at least twice the first distance.

20. The optical coupler according to claim 10, wherein the first lens and the second lens are located at a same height.

21. The optical coupler according to claim 1 wherein when each contact element penetrates a corresponding elongated groove by the predefined distance, at least a majority of the contact element is not parallel to the corresponding elongated groove.

22. The optical coupler according to claim 15 wherein when each contact element penetrates a corresponding elongated groove by the predefined distance, at least a majority of the contact element is not parallel to the corresponding elongated groove.

23. The method according to claim 18 wherein when each contact element penetrates a corresponding elongated groove by the predefined distance, at least a majority of the contact element is not parallel to the corresponding elongated groove.

* * * * *